US010727886B2

(12) United States Patent
Pister et al.

(10) Patent No.: US 10,727,886 B2
(45) Date of Patent: Jul. 28, 2020

(54) CRYSTAL FREE RADIO

(71) Applicant: The Regents of the University of California, Oakland, CA (US)

(72) Inventors: Kristofer S. J. Pister, Orinda, CA (US); Osama Ullah Khan, Berkeley, CA (US); Bradley Wheeler, Berkeley, CA (US); David C. Burnett, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/099,992

(22) PCT Filed: May 8, 2017

(86) PCT No.: PCT/US2017/031596
§ 371 (c)(1),
(2) Date: Nov. 8, 2018

(87) PCT Pub. No.: WO2018/026404
PCT Pub. Date: Feb. 8, 2018

(65) Prior Publication Data
US 2019/0280725 A1    Sep. 12, 2019

Related U.S. Application Data

(60) Provisional application No. 62/333,506, filed on May 9, 2016.

(51) Int. Cl.
*H04B 1/26* (2006.01)
*H03K 3/03* (2006.01)
*H04B 1/38* (2015.01)

(52) U.S. Cl.
CPC ............. *H04B 1/26* (2013.01); *H03K 3/0315* (2013.01); *H04B 1/38* (2013.01)

(58) Field of Classification Search
CPC ............ H04B 1/26; H04B 1/38; H03K 3/0315
See application file for complete search history.

(56) References Cited

U.S. PATENT DOCUMENTS 4,837,853 A * 6/1989 Heck ...................... H03D 3/242
329/325
2007/0189428 A1 * 8/2007 Knerr ........................ H03L 1/00
375/354

(Continued)

FOREIGN PATENT DOCUMENTS

WO    2010/043992 A1    4/2010

OTHER PUBLICATIONS

International Search Report and Written Opinion issued in PCT/US2017/031596, dated May 15, 2018.

*Primary Examiner* — Nguyen T Vo
(74) *Attorney, Agent, or Firm* — Venable LLP; Henry J. Daley (57) ABSTRACT

A crystal-free radio includes an antenna; a receiver configured to communicate with the antenna; a local radio frequency (RF) oscillator configured to communicate with the receiver; and a clock circuit configured to communicate with the receiver and the local RF oscillator, the clock circuit having an electronic circuit oscillator. The local RF oscillator is a free-running oscillator. The clock circuit is configured to receive a calibration signal via a wireless network and calibrate the electronic circuit oscillator based on the received calibration signal, and the clock circuit is a crystal-free clock circuit.

19 Claims, 5 Drawing Sheets

(56) References Cited

U.S. PATENT DOCUMENTS

| | | | |
|---|---|---|---|
| 2008/0079502 A1* | 4/2008 | Huang | H03K 5/1565 |
| | | | 331/16 |
| 2009/0322400 A1 | 12/2009 | Kuo | |
| 2013/0034197 A1 | 2/2013 | Aweya et al. | |
| 2013/0162399 A1* | 6/2013 | Flammer, III | G06K 7/10039 |
| | | | 340/10.1 |
| 2016/0028405 A1* | 1/2016 | Caffee | H03L 7/02 |
| | | | 331/66 |
| 2016/0126964 A1 | 5/2016 | Huang et al. | |

* cited by examiner

CRYSTAL FREE RADIO

CROSS-REFERENCE TO RELATED APPLICATIONS

This application is a National Stage Application under 35 U.S.C. § 371 of PCT/US2017/031596, filed on May 8, 2017, which claims priority benefit from U.S. Provisional Patent Application No. 62/333,506 filed on May 9, 2016, the entire content of which is incorporated herein by reference. The present application is related to U.S. provisional patent application No. 62/300,646, filed on Feb. 26, 2016 and to PCT International Application No. PCT/US2017/019721, filed on Feb. 27, 2017 both entitled "Time Synchronized Networks of Wireless Nodes and the Wireless Nodes," the entire content of each is also incorporated herein by reference. All references cited anywhere in this specification, including the Background and Detailed Description sections, are incorporated by reference as if each had been individually incorporated.

STATEMENT OF GOVERNMENT INTEREST

The present invention was made with the United States government support under Grant Number HR0011-14-2-0001 awarded by the U.S. Defense Advanced Research Projects Agency (DARPA). The U.S. government has certain rights in the invention.

BACKGROUND

1. Field

The present application is directed to radios and wireless networks, and in particular to crystal-free radios and wireless networks that include crystal-free radios.

2. Background

Almost every current standard compliant wireless system uses quartz technology (e.g., a quartz crystal) for precise timing and frequency reference. The quartz crystal (Xtal) is a bulky off-chip component that puts a size limitation towards miniaturization and adds to the Bill of Material (BOM) cost of a sensor node. Accordingly, improved systems and methods are required for precise timing and frequency references in wireless systems.

SUMMARY OF THE DISCLOSURE

An aspect of the present disclosure is to provide a crystal-free radio, including an antenna; a receiver configured to communicate with the antenna; a local radio frequency (RF) oscillator configured to communicate with the receiver; and a clock circuit configured to communicate with the receiver and the local RF oscillator, the clock circuit having an electronic circuit oscillator. The local RF oscillator is a free-running oscillator. The clock circuit is configured to receive a calibration signal via a wireless network and calibrate the electronic circuit oscillator based on the received calibration signal, and the clock circuit is a crystal-free clock circuit.

Another aspect of the present disclosure is to provide a crystal-free radio, including an antenna; a receiver configured to communicate with the antenna; a local radio frequency (RF) oscillator configured to communicate with the receiver, the local RF oscillator being a free-running oscillator; and a clock circuit configured to communicate with the receiver and the local RF oscillator, the clock circuit having a frequency measurement component. The receiver includes a demodulator constructed and configured to demodulate a received signal and output a feedback signal based on the demodulated signal and to communicate with the clock circuit and to send the feedback signal to the frequency measurement component of the clock circuit. The frequency measurement component is configured to measure a frequency of the received signal based on the feedback signal and to send a signal to tune the RF oscillator to the frequency of the received signal.

A further aspect of the present disclosure is to provide a wireless network. The wireless network includes a first crystal-free radio node having a transmitter configured to communicate with an antenna; and a local radio frequency (RF) oscillator configured to communicate with the transmitter, the local RF oscillator being a free-running oscillator; and The wireless network further includes a second crystal-free radio node having a receiver in communication with the transmitter through an antenna, the receiver including a local RF oscillator, the receiver being configured to receive an RF signal from the transmitter. The local RF oscillator of the receiver of the second crystal-free radio is configured to track an RF frequency of the received RF signal from the transmitter of the first crystal-free radio node.

Another aspect of the present disclosure is to provide a method of communicating between a plurality of crystal-free radio nodes. The method includes transmitting an RF signal from a transmitter of a first crystal-free radio node in the plurality of crystal-free radio nodes, the first crystal-free radio node comprising a local radio frequency (RF) oscillator configured to communicate with the transmitter, the local RF oscillator being a free-running oscillator; receiving the RF signal by a receiver of a second crystal-free radio node in the plurality of crystal-free radio nodes, the second crystal-free radio node comprising a local RF oscillator configured to communicate with the receiver; and tracking, by the local RF oscillator of the second crystal-free radio node, an RF frequency of the received RF signal from the transmitter of the first crystal-free radio node.

Yet another aspect of the present disclosure is to provide a crystal-free radio, including an antenna; a transmitter configured to communicate with the antenna; a local radio frequency (RF) oscillator configured to communicate with the transmitter, the local RF oscillator being a free-running oscillator; and a clock circuit configured to communicate with the transmitter and the local RF oscillator. The clock circuit having an electronic circuit oscillator, the clock circuit being a crystal-free clock circuit. In an embodiment, the transmitter and the local RF oscillator are implemented on a same integrated circuit (IC) chip.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention.

Some embodiments of the invention are directed to a radio architecture that requires no external off-chip frequency reference for standard compliant, low-power, low-cost, crystal-free wireless communication. The radio architecture can be used for low-cost, battery-less wireless sensors for Internet of Things (IoT) applications, for example. However, the general concepts of this inventions are not limited to only IoT applications.

Figure 1A:
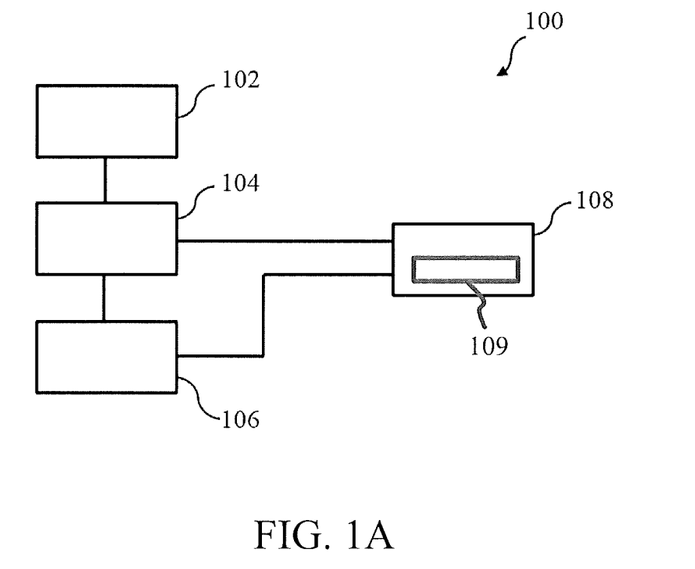
FIG. 1A depicts a schematic diagram of crystal-free radio, according to an embodiment of the present disclosure.

FIG. 1A depicts a schematic diagram of crystal-free radio according to an embodiment of the present disclosure. In an embodiment, the crystal-free radio 100 includes an antenna 102, a receiver (RX) 104 configured to communicate with the antenna 102, and a local radio frequency (RF) oscillator 106 configured to communicate with the receiver 104. The crystal-free radio 100 also includes a clock circuit 108 configured to communicate with the receiver 104 and the local RF oscillator 106, the clock circuit 108 including an electronic circuit oscillator 109. In an embodiment, the local RF oscillator 106 is a free-running oscillator. In an embodiment, the clock circuit 108 is configured to receive a calibration signal via a wireless network and calibrate the electronic circuit oscillator 109 of the clock circuit 108 based on the received calibration signal. In an embodiment, the clock circuit 108 is a crystal-free clock circuit.

Figure 1B:
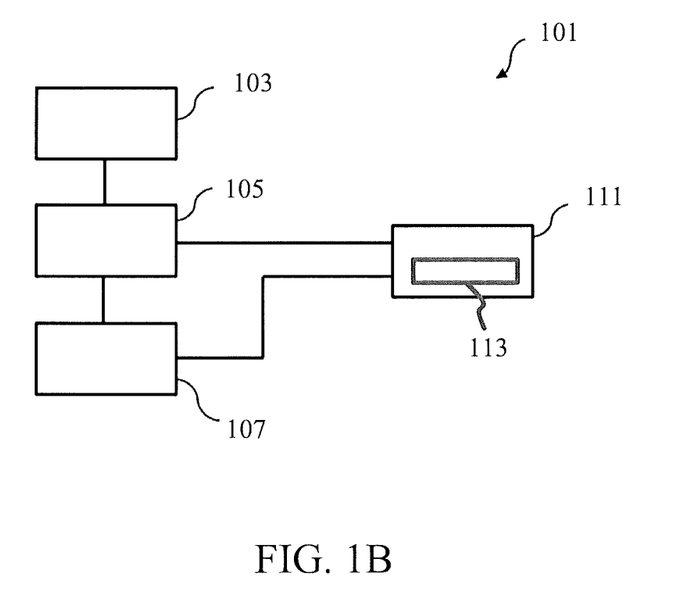
FIG. 1B depicts a schematic diagram of crystal-free radio, according to another embodiment of the present disclosure.

FIG. 1B depicts a schematic diagram of crystal-free radio according to another embodiment of the present disclosure. In this embodiment, the crystal-free radio 101 includes an antenna 103, a transmitter (TX) 105 configured to communicate with the antenna 103, and a local radio frequency (RF) oscillator 107 configured to communicate with the transmitter TX 105. Ian embodiment, the crystal-free radio 101 may also include a clock circuit 111 configured to communicate with the transmitter 105 and the local RF oscillator 107, the clock circuit 111 including an electronic circuit oscillator 113. In an embodiment, the local RF oscillator 107 is a free-running oscillator. In an embodiment, the clock circuit 111 is a crystal-free clock circuit. In an embodiment, the transmitter (TX) 105 is configured to transmit a signal at the RF frequency of the local RF oscillator 107 using antenna 103. In an embodiment, the transmitter 105 and the local RF oscillator 107 are implemented on a same integrated circuit (IC) chip.

Figure 2:
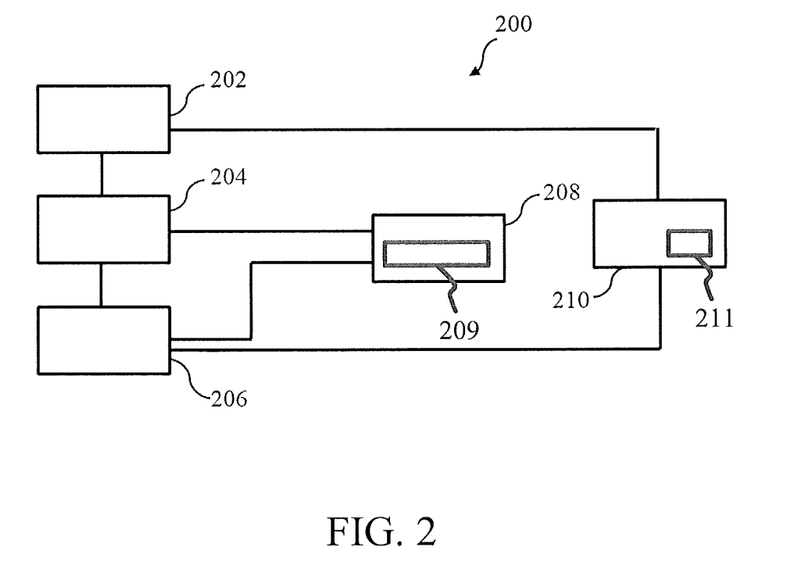
FIG. 2 depicts a schematic diagram of a crystal-free radio, according to yet another embodiment of the present disclosure.

FIG. 2 depicts a schematic diagram of a crystal-free radio 200 according to another embodiment of the present disclosure. In an embodiment, the crystal-free radio 200 includes an antenna 202, a receiver (RX) 204 configured to communicate with the antenna 202, and a local radio frequency (RF) oscillator 206 configured to communicate with the receiver 204. The crystal-free radio 200 also includes a clock circuit 208 configured to communicate with the receiver 204 and the local RF oscillator 206. The clock circuit 208 includes an electronic circuit oscillator 209. In an embodiment, the crystal-free radio 200 further includes a transmitter (TX) 210 in communication with the antenna 202 and the local RF oscillator 206. The transmitter 210 comprises a modulator 211. The transmitter 210 uses an RF signal from the local RF oscillator 206 to produce a carrier signal, and the modulator 211 modulates the carrier signal based on a data stream for transmission. In an embodiment, the crystal-free radio 200 also includes a second local RF oscillator (not shown), and uses an RF signal from the second local RF oscillator to produce the carrier signal.

In an embodiment, during wireless communication between two wireless sensor nodes, the receiver 204 or transmitter 210 in one wireless sensor node (crystal-free radio) 200 tracks a frequency of a receiver or transmitter in another wireless node (crystal free radio, not shown). For example, the receiver 104 of wireless sensor node (crystal free radio) 100 can track a frequency of the transmitter 210 free running a local oscillator (LO) frequency.

Figure 3:
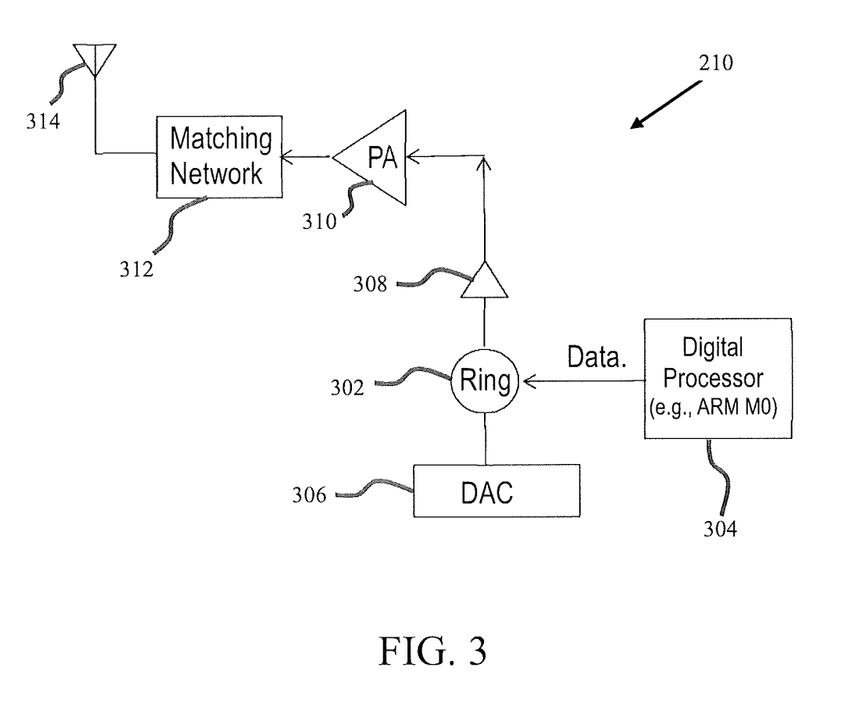
FIG. 3 depicts a simplified block diagram of a transmitter, according to an embodiment of the present disclosure.

FIG. 3 depicts a simplified block diagram of the transmitter 210 according to an embodiment of the present disclosure. As shown in FIG. 3, the transmitter 210 comprises a frequency calibrated free-running RF oscillator (LC/ring) 302. In an embodiment, the RF oscillator 302 can be frequency calibrated with a low frequency RC (relaxation) or MEMS based oscillator. The low frequency RC (relaxation) or MEMS based oscillator is described in detail in the following paragraphs while referring to FIG. 4. The low frequency RC oscillator is frequency calibrated over a wireless sensor network. The digital processor 304 produces a data stream that directly modulates the RF oscillator 302. In an embodiment, the digital processor 304 can be, for example, an ARM Cortex-M0 processor manufactured by ARM Ltd. However, as it can be appreciated other digital processors can also be used as well as a simple finite state machine. In the embodiment illustrated in FIG. 3, the digital processor 304 is used to produce a data stream to modulate the RF oscillator. However, as it must be appreciated that any digital system can be used and is not limited to a digital processor or digital microprocessor. The term "free-running RF oscillator" is intended to mean an oscillator that is not phase-locked with a local reference physically coupled to the same structure as the oscillator. One example of a free-running RF oscillator, according to an embodiment of the present disclosure, is a local oscillator that has no phase-locked or frequency-locked loop for maintaining the precise oscillator frequency. Another example of a free-running RF oscillator, according to an embodiment of the current disclosure, is the local oscillator of the receiver 104. The transmitter 210 also includes a digital-analog converter (DAC) 306 in communication with the RF oscillator 302. In an embodiment, the DAC 306 provides a coarse and/or fine tuning frequency to the RF oscillator (ring oscillator) 302 to calibrate the RF oscillator 302. The transmitter is also provided with a buffer 308 and a power amplifier 310. The buffer 308 connects the RF oscillator 302 to the power amplifier (PA) 310. The buffer 308 drives the power amplifier 310 which amplifies the signal coming from the RF oscillator 302 and the amplified signal is then transmitted or radiated through the antenna 314. The transmitter 210 also includes a matching network 312 connected to the power amplifier 310 and an antenna 314 connected to the matching network 312. The matching network 312 matches an impedance of the antenna 314 with an impedance of the rest of the components of the transmitter 210. In an embodiment, the antenna 314 can be the same common antenna 202 of the crystal-free radio 200 (shown in FIG. 2).

Figure 4:
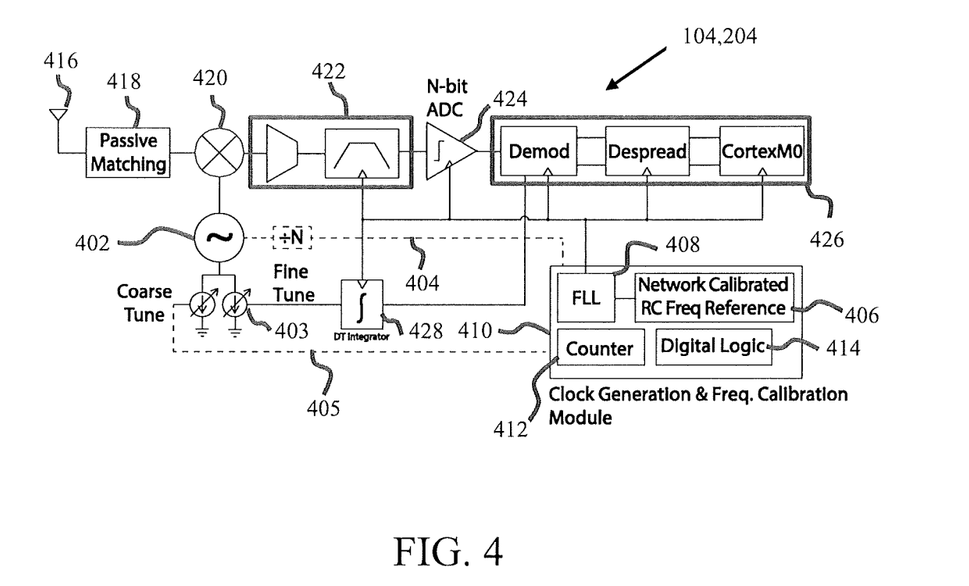
FIG. 4 is block diagram of a crystal-free receiver, according to an embodiment of the present disclosure.

FIG. 4 is block diagram of the crystal-free receiver 104,204, according to an embodiment of the present disclosure. The crystal-free receiver 104, 204 includes RF oscillator 402. In an embodiment, an initial frequency calibration of free-running RF oscillator 402 is shown in the dashed communication line 404 in FIG. 4. The frequency of the RF oscillator 402 is divided by N to obtain a lower frequency. In an embodiment, the resulting divided frequency (RF oscillator frequency divided by N) is used for an on-chip frequency measurement using a frequency measurement component (e.g., counter) 412 in a clock generation and frequency calibration module 410 of the crystal-free receiver 104, 204. Although a counter 412 is shown herein as being used as a frequency measurement component, this is merely one example of implementation of a frequency measurement component. As it must be appreciate other types of frequency measuring components can also be used. The counter 412 uses a frequency of a low-frequency RC oscillator 406 in the clock generation and frequency calibration module 410 as a frequency reference and measures the divided frequency from the RF oscillator 402 (divided by N). The measured frequency of the RF oscillator 402 divided by N is compared to the frequency reference of the low-frequency RC oscillator 406. In an embodiment, the comparison is performed by a controller 414 (e.g., a digital logic controller) in the clock generation and frequency calibration module 410 which is in communication with both the RC oscillator 406 and the counter 412. Based on the comparison, the controller 414 determines whether the measured frequency from the RF oscillator 402 divided by N is lower than or higher than the frequency reference from the RC oscillator 406. The controller 414 (e.g., digital logic controller) in the clock generation and frequency calibration module 410 then controls a coarse tuning or a fine tuning 403 of the frequency of the RF oscillator 402 though communication line 405 so as to tune the frequency of the RF oscillator 402 to the frequency reference of the RC oscillator 406.

The term "low-frequency" in low-frequency RC oscillator 406 is used to indicate that the frequency of the signal from the RC oscillator 406 is lower than a frequency of a signal from the RF oscillator 402. The frequency of a signal in the low-frequency RC oscillator 406 within the clock generation and frequency calibration module 410 is used as the frequency reference and is calibrated through a network (i.e., network calibrated). A detailed description regarding a calibration of a network calibrated RC oscillator is provided in U.S. provisional patent application No. 62/300,646, filed on Feb. 26, 2016 and in PCT International Application No. PCT/US2017/019721, filed on Feb. 27, 2017 both entitled "Time Synchronized Networks of Wireless Nodes and the Wireless Nodes," the entire content of each is incorporated herein by reference.

A frequency locked loop (FLL) 408 is provided within the clock generation and frequency calibration module 410. The FLL is a module that generates various processing signals and clock signals using the frequency reference generated by the low-frequency RC oscillator 406. Although an FLL is used herein to generate various clock signals, a phase locked loop (PLL) can instead be used to perform a similar function. In an embodiment, the FLL 408 is fully digital. However, in another embodiment, the FLL 408 can also be implemented entirely in the analog domain. The FLL 408 is in communication with the counter 412 and the low-frequency RC oscillator 406. The clock signals from the FLL or PLL are used by the counter 412 to measure the frequency from the RF oscillator 402. Although a counter 412 is used herein to measure the frequency from RF oscillator 402, as it must be appreciated other means for measuring the frequency of the RF oscillator can also be employed.

The crystal-free receiver 104, 204 includes an antenna 416, a matching network 418, a mixer 420, a filtering module 422, an analog to digital converter (ADC) 424, and a digital signal processor (DSP) 426. A signal received through the antenna 104 is transmitted via the mixer 418 to the filtering module 422. The RF oscillator 402 drives the mixer 420 to down-convert the received signal to low RF frequency. The down-converted signal is transmitted to filtering module 422 for filtering and amplification and then transmitted to the ADC 424 for converting the signal from analog to digital to obtain a digital signal. The signal is then processed in the digital domain using digital signal processor 426. In an embodiment, the DSP 426 includes a demodulation (demod.) component, a de-spread component and a processor (e.g., an ARM cortex-M0 processor). The processor may be similar to the digital processor 304 described above with reference to FIG. 3. The filtering module 422, the analog to digital converter (ADC) 424, and the digital signal processor (DSP) 426 all receive clock signals from the FLL 408 in the clock generation and frequency calibration module 410. The demodulation (demod.) component in the filtering module 422 provides an output signal to a discreet time (DT) integrator 428. The DT integrator 428 uses signal from the demod. component in the DSP 426 and send a signal to a coarse tuning or fine tuning 403 of the RF oscillator 402.

The RF oscillator 402 is frequency calibrated using the clock generation and frequency calibration module 410 with the frequency reference provided by the RC oscillator 406 for all the possible operating frequencies. The calibrated frequency of the RF oscillator 402 can then be stored on an on-chip memory (not shown) for coarse tuning of the RF oscillator 402. The calibrated frequency of the RF oscillator 402 can be periodically updated or repeated on-chip to take into account for a change or variation in either the operating or environmental conditions or both. For example, in an embodiment, a temperature sensor can be provided within the receiver 104, 204 so as to measure an ambient temperature where the receiver 104, 204 is placed. If a certain difference temperature ($\Delta T$) is measured between an initial time at an initial calibration of the RF frequency of the RF oscillator 402 and a subsequent time, a further calibration of the frequency of RF oscillator 402 using, among other things, the RC oscillator 406 can be performed to take into account the temperature variation. The frequency of calibration may depend on a number of factors including how often environmental factors (e.g., temperature) change over time. If, for example, the receiver is located in an environment where the environment factors (e.g., temperature) do not substantially vary over time, then calibrating the RF oscillator may be performed only once or may be few times to insure that the calibration frequency data did not change. However, if the receiver is located in an environment where the environment factors (e.g., temperature) substantially change over time, then the prior calibration frequency data may need to be updated to account for a drift in frequency due to the environmental factors (e.g., temperature).

In an embodiment, in a two or more node configuration, a first node (i.e., a first crystal-free radio) has a transceiver (a receiver and a transmitter) and a second node (i.e., a second crystal free radio) has a transceiver (a receiver and a transmitter). For example, the first node can operate in a transmit mode while the second node can operate in the receive mode. In this case, the transmitter of the first node transmits a signal while the receiver of the second node receives the signal. For illustration, transmitter 210 shown in FIG. 3 can correspond to the transmitter in the first node while the receiver 104 shown in FIG. 4 can correspond to the receiver in the second node. The transmitter 210 in the first node has its RF oscillator 302 free running which is different from a conventional radio wherein the RF oscillator is usually locked in a phase locked loop (PLL). In contrast, in an embodiment of the present disclosure, the RF oscillator (e.g., RF oscillator 302) on the transmit side, i.e., in the transmitter of the first node (e.g., transmitter 210), is not locked in PLL and is configured to run freely. The receiver 104 in the second node receives the signal from the transmitter 210 in the first node and tracks the RF signal coming in from the transmitter 210. The receiver 104 will try to follow the RF frequency of the free running oscillator 302 of the transmitter 210. In this case, the signal coming from the demod. of the DSP 426 into the DT integrator 428 is used to control the tuning of the RF oscillator 402 by using coarse/fine tuners 403. The receiver will follow the RF frequency of the free running oscillator 302 during at least a transmission of data packets from the transmitter 210 to the receiver 104.

Therefore, as it can be appreciated from the above paragraphs, an initial calibration of the RF oscillator 402 can be performed through the dashed lines 404 and 405 using the clock generation and frequency calibration module 410. The controller 414 (e.g., digital logic controller) in the clock generation and frequency calibration module 410 controls a coarse tuning or a fine tuning 403 of the frequency of the RF oscillator 402 though communication line 405 so as to tune the frequency of the RF oscillator 402 to the frequency reference of the RC oscillator 406. The calibrated frequency information can be stored in a memory. As stated above, the receiver 104 can also follow the RF frequency of the free running oscillator 302 of the transmitter 210. In the "following" case, the signal coming from the demod. of the DSP 426 into the DT integrator 428 is used to control the tuning of the RF oscillator 402 by using coarse/fine tuners 403. In the "following" case, the dashed lines 404 and 405 are not used.

Figure 5:
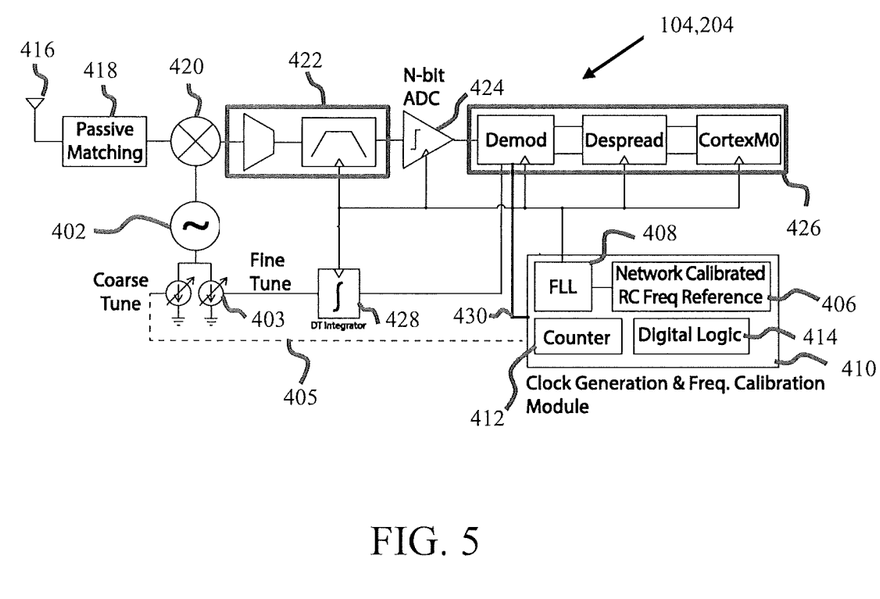
FIG. 5 is block diagram of a crystal-free receiver, according to another embodiment of the present disclosure.

FIG. 5 is block diagram of the crystal-free receiver 104,204, according to another embodiment of the present disclosure. In FIG. 5, similar reference numerals are used herein to indicate similar components. The crystal-free receiver 104, 204 shown in FIG. 5 is similar in many aspects to the crystal free receiver 104, 204 shown in FIG. 4. Therefore, the description of similar components is not repeated in the following paragraphs. However, it must be noted that one difference between the configuration of the receiver shown FIG. 4 and the configuration of the receiver shown FIG. 5 is that in the receiver configuration shown in FIG. 4, the demodulation (demod.) component in the DSP 426 is connected to the DT integrator 428, whereas in the receiver configuration shown in FIG. 5, the demodulation (demod.) component in the DSP 426 is connected to both the DT integrator 428 and also to the clock generation and frequency calibration module 410 via communication line 430.

In this configuration, the calibration of the RF oscillator 402 using the RC oscillator 406 to tune the frequency of the RF oscillator 402 is not needed. Instead, the tuning of the RF oscillator 402 is performed using the frequency of the signal received from a transmitter (e.g., transmitter 210). The signal received by the antenna 416 of the receiver is processed or passed through matching network 418, mixer 420, filtering module 422, ADC 424 and sent to DSP 426. The demodulator (demod.) component in DSP 426 can then send an Intermediate Frequency (IF) signal having a frequency lower than the RF frequency to the clock generation and frequency calibration module 410 via line 430. A frequency of the signal received by the clock generation and frequency calibration module 410 which corresponds to the frequency of the signal received by the antenna 416 of the receiver 104 from the transmitter 210 is measured by the counter 412. The controller (e.g., digital logic controller) 414 sends a signal to control the coarse or fining tuning 403 of the RF oscillator 402 via communication line 405 to tune the frequency of the RF oscillator 402 to the frequency of the signal received through antenna 416 from the transmitter 210.

In an embodiment of the present disclosure, a calibration of the RF oscillator 402 can be performed as follows. Initially, one of more crystal-free wireless sensor nodes power-up from harvested energy or from any form of energy storage device or from an event triggered by a sensor. First, the one or more crystal-free nodes receive a frequency calibration signal over the network to discipline the respective low-frequency RC oscillators 402 in the one or more crystal-free wireless sensor nodes. Second, the low-frequency RC oscillators 402 can then be used as a frequency reference to frequency calibrate the free-running RF oscillators in the respective one or more crystal-free wireless sensor nodes. Third, the frequency calibrated RF oscillators 402 in the respective one or more crystal-free wireless sensor nodes are then allowed to transmit the RF signal in the transmit mode to talk to other crystal-free wireless sensor nodes.

In another embodiment, a calibrated RF signal can be transmitted on one or all the RF channels to the crystal-free wireless sensor nodes while the nodes are being tested on a commercial IC tester, for example while the crystal-free wireless sensor nodes are being manufactured and tested at the wafer-scale.

In another embodiment, in crystal-free wireless sensor nodes being operated in the field, a calibrated RF signal can be transmitted to the crystal-free wireless sensor nodes on one or all the RF channels.

In an embodiment, as described in the above paragraphs, the RF oscillator of a transmitter is free-running while a RF oscillator of a receiver is tracking the frequency of RF oscillator of the transmitter during an entire RF packet reception. However, in another embodiment, the RF oscillator of the transmitter can also be frequency locked to a local frequency reference while the RF oscillator of the receiver is free-running during the entire RF packet reception.

Wirelesss sensor networks have wide spread commercial applications including: (1) industrial IoT such as asset Health Monitoring for need based maintenance, Connected Machines, Smart Buildings and Factories, and Cloud Robotics; (2) Environment Monitoring such as Wireless gas sensor network and Smart Home/Cities; (3) Integrated Flight Systems, such as Intelligent health monitoring for hybrid and/or all electric distributed propulsion systems, Unmanned Aircraft Systems (UAS) Technology, Multi-vehicle cooperation and interoperability using wireless sensor network, Sensing, perception, cognition, and decision making—Inexpensive, reliable, and secure communications. Furthermore, a wireless sensor network have potential application in the avionics industry. This allows to reduce the mass and volume of spacecraft by eliminating large heavy cable runs. Furthermore, wireless sensor network using the described architecture can be particularly useful for small satellites, where internal volume is often highly constrained particularly for subsystem cables and connectors. The use of the described wireless networks that employs the above transmitter and receiver configuration would enable smaller and lighter spacecraft.

In addition, transfer data across pressure interfaces into remote locations where it is difficult to run cables and onto movable structures where cables are at risk of failure can be implemented. Furthermore, wireless sensor networks can (1) provide less intrusive measurement and health monitoring capability by enabling sensors within fuel tanks and pipes and across pressure interfaces without breaching the structure; (2) support late additions or mission enhancements by significantly limiting changes to vehicle structure and data paths; (3) function despite structural failures that can break physical wires such as those caused by micrometeorite impacts or connector contamination, thereby creating heterogeneous redundancy for critical systems that improve reliability and safety; (4) support dynamic reconfiguration of networks and components, enabling robust response to faults or changes in operating mode.

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments of the disclosure may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present disclosure contemplates that, to the extent possible, one or more features of any embodiment can be combined with one or more features of any other embodiment.

We claim:

1. A crystal-free radio, comprising:
   an antenna;
   a receiver configured to communicate with the antenna;
   a local radio frequency (RF) oscillator configured to communicate with the receiver; and
   a clock circuit configured to communicate with the receiver and the local RF oscillator, the clock circuit comprising an electronic circuit oscillator,
   wherein the local RF oscillator is a free-running oscillator,
   wherein the clock circuit is configured to receive a calibration signal via a wireless network and calibrate the electronic circuit oscillator based on the received calibration signal,
   wherein the clock circuit is a crystal-free clock circuit, and
   wherein the electronic circuit oscillator comprises an RC oscillator configured to provide a reference frequency to the local RF oscillator to calibrate the local RF oscillator.

2. The crystal-free radio according to claim 1, wherein the clock circuit further comprises a frequency measurement component configured to measure a frequency of a signal received by the receiver.

3. The crystal-free radio according to claim 2, wherein the clock circuit further comprises a controller configured to compare the reference frequency with the measured frequency and send a signal to tune the RF oscillator at the reference frequency.

4. The crystal-free radio according to claim 1, further comprising:
   a transmitter in communication with the antenna and the local RF oscillator, the transmitter comprising a modulator,
   wherein the transmitter uses an RF signal from the local RF oscillator to produce a carrier signal, and
   wherein the modulator modulates the carrier signal based on a data stream for transmission.

5. The crystal-free radio according to claim 1, further comprising:
   a second local RF oscillator, and
   a transmitter in communication with the antenna and the second local RF oscillator, the transmitter comprising a modulator,
   wherein the second local RF oscillator is a free-running oscillator,
   wherein the transmitter uses an RF signal from the second local RF oscillator to produce a carrier signal, and
   wherein the modulator modulates the carrier signal based on a data stream for transmission.

6. The crystal-free radio according to claim 1, wherein the receiver is configured to track a carrier frequency of a signal received from a second crystal-free radio comprising a free-running oscillator.

7. The crystal-free radio according to claim 1, wherein the receiver comprises a demodulator constructed and configured to demodulate a received signal and output a feedback signal based on the demodulated signal, and
   wherein the local RF oscillator provides an RF frequency that is tuned based on the feedback signal.

8. The crystal-free radio according to claim 1, wherein the receiver, the local RF oscillator, and the clock circuit are structured as a single-chip semiconductor device on one semiconductor die.

9. The crystal-free radio according to claim 8, wherein the single-chip semiconductor device is a complementary metal-oxide semiconductor (CMOS) device.

10. The crystal-free radio according to claim 8, wherein the antenna is a further structure on the single-chip semiconductor device on the one semiconductor die.

11. The crystal-free radio according to claim 8, further comprising:
    a transmitter in communication with the antenna and the local RF oscillator,
    wherein the transmitter is a further structure on the single-chip semiconductor device on the one semiconductor die.

12. The crystal-free radio according to claim 1, further comprising a source of electrical energy in electrical connection with the receiver, the local RF oscillator, and the clock circuit to power the crystal-free radio.

13. The crystal-free radio according to claim 12, wherein the source of electrical energy is a further structure on a single-chip semiconductor device on one semiconductor die.

14. The crystal-free radio according to claim 13, wherein the source of electrical energy comprises an energy scavenging structure that extracts energy from a local environment of the crystal-free radio.

15. The crystal-free radio according to claim 14, wherein the energy scavenging structure is a photovoltaic cell.

16. The crystal-free radio according to claim 12, further comprising an energy storage structure in electrical connection with the source of electrical energy.

17. The crystal-free radio according to claim 16, wherein the energy storage structure comprises at least one of a battery, a capacitor, or a supercapacitor.

18. A crystal-free radio, comprising:
an antenna;
a receiver configured to communicate with the antenna;
a local radio frequency (RF) oscillator configured to communicate with the receiver; and
a clock circuit configured to communicate with the receiver and the local RF oscillator, the clock circuit comprising an electronic circuit oscillator,
wherein the local RF oscillator is a free-running oscillator,
wherein the clock circuit is configured to receive a calibration signal via a wireless network and calibrate the electronic circuit oscillator based on the received calibration signal,
wherein the clock circuit is a crystal-free clock circuit,
wherein the receiver comprises a demodulator constructed and configured to demodulate a received signal and output a feedback signal based on the demodulated signal, and
wherein the local RF oscillator provides an RF frequency that is tuned based on the feedback signal, and
wherein the demodulator is configured to communicate with the clock circuit and send an intermediate or lower frequency signal to a frequency measurement component of the clock circuit.

19. The crystal-free radio according to claim 18, wherein the frequency measurement circuit is configured to measure a frequency of the received signal based on the intermediate or lower frequency signal and send a signal to tune the RF oscillator to the frequency of the received signal.

* * * * *